US012804853B2

(12) United States Patent
Jia et al.

(10) Patent No.: US 12,804,853 B2
(45) Date of Patent: Nov. 17, 2026

(54) LIQUID COOLING STRUCTURE AND ELECTRONIC APPARATUS

(71) Applicant: HUAWEI TECHNOLOGIES CO., LTD., Shenzhen (CN)

(72) Inventors: Hui Jia, Shenzhen (CN); Xinye Zhang, Shenzhen (CN); Chenxi Feng, Dongguan (CN); Jie Yang, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 235 days.

(21) Appl. No.: 18/679,732

(22) Filed: May 31, 2024

(65) Prior Publication Data

US 2024/0324143 A1 Sep. 26, 2024

Related U.S. Application Data

(63) Continuation of application No. PCT/CN2022/131522, filed on Nov. 11, 2022.

(30) Foreign Application Priority Data

Dec. 3, 2021 (CN) ......................... 202111466572.5

(51) Int. Cl.
*H05K 7/20* (2006.01)
*H05K 1/02* (2006.01)

(52) U.S. Cl.
CPC ....... *H05K 7/20327* (2013.01); *H05K 1/0203* (2013.01); *H05K 7/20318* (2013.01); *H05K 2201/064* (2013.01)

(58) Field of Classification Search
CPC ............. H05K 7/20327; H05K 1/0203; H05K 7/20318; H05K 2201/064; H05K 7/20345;

(Continued)

(56) References Cited

U.S. PATENT DOCUMENTS 5,491,363 A 2/1996 Yoshikawa
5,522,452 A * 6/1996 Mizuno ............... H10W 40/475
165/286

(Continued)

FOREIGN PATENT DOCUMENTS

CN 1819418 A 8/2006
CN 101282075 A 10/2008

(Continued)

OTHER PUBLICATIONS

Wang Hongwei, "Immersed server cooling system", Nov. 5, 2021, Suzhou Inspur Intelligent Technology Co., Ltd., Entire Document (Translation of CN 113608592). (Year: 2021).*

(Continued)

*Primary Examiner* — Stephen S Sul

(57) ABSTRACT

A liquid cooling structure is provided. The structure includes a liquid storage portion, a condenser, a liquid return channel and a liquid cooling portion having a liquid storage cavity configured to store a liquid state cooling medium. The liquid cooling portion includes a spraying member and a sealing member having a first sealed cavity configured to accommodate a to-be-cooled member, the spraying member communicates with the liquid storage cavity, and is configured to spray the cooling medium onto the to-be-cooled member. The condenser communicates with the first sealed cavity and the liquid storage cavity, and is configured to cool the gaseous state cooling medium to form the cooling medium in the liquid state. The liquid return channel communicates with the first sealed cavity and the liquid storage cavity, and is configured to transfer the liquid state cooling medium in the first sealed cavity to the liquid storage cavity.

19 Claims, 3 Drawing Sheets

(58) Field of Classification Search
CPC ... H05K 7/20809; H05K 7/208; H10W 40/47; Y02D 10/00
See application file for complete search history.

(56) References Cited

U.S. PATENT DOCUMENTS

| | | | | |
|---|---|---|---|---|
| 6,205,799 | B1 * | 3/2001 | Patel | H10W 40/475 236/46 F |
| 6,571,569 | B1 * | 6/2003 | Rini | H05K 7/20345 62/304 |
| 7,044,768 | B1 | 5/2006 | Tilton et al. | |
| 7,184,269 | B2 * | 2/2007 | Campbell | H05K 7/2079 174/15.1 |
| 2002/0112498 | A1 * | 8/2002 | Bash | G06F 1/20 62/304 |
| 2007/0133173 | A1 * | 6/2007 | Hsiung | H05K 7/20345 361/699 |
| 2007/0193300 | A1 * | 8/2007 | Tilton | F25B 43/04 257/E23.088 |
| 2017/0234623 | A1 * | 8/2017 | Fried | H05K 7/20336 165/104.26 |
| 2019/0074669 | A1 * | 3/2019 | Woolard | F28D 15/043 |
| 2020/0105645 | A1 * | 4/2020 | Mydlarski | H10W 40/475 |
| 2020/0329551 | A1 * | 10/2020 | Yamamoto | H05K 7/20509 |
| 2021/0307210 | A1 * | 9/2021 | Wong | H05K 7/20327 |
| 2022/0178631 | A1 * | 6/2022 | Yang | H05K 7/20272 |
| 2022/0413570 | A1 * | 12/2022 | Nagimov | G06F 1/20 |
| 2023/0045752 | A1 * | 2/2023 | Chen | G06F 1/20 |
| 2024/0008220 | A1 * | 1/2024 | Kadhim | H05K 7/20272 |

FOREIGN PATENT DOCUMENTS

| | | | | |
|---|---|---|---|---|
| CN | 102342191 | B | 6/2014 | |
| CN | 110213934 | A | 9/2019 | |
| CN | 112099591 | A | 12/2020 | |
| CN | 112099592 | A | 12/2020 | |
| CN | 213214146 | U | 5/2021 | |
| CN | 113301769 | A | 8/2021 | |
| CN | 113608592 | A * | 11/2021 | G06F 1/20 |

OTHER PUBLICATIONS

PChome ,CITE2020 Sugon showcases Silicon Cube liquid phase change cooling computer, https://article.pchome.net/content-2115319.html ,Aug. 15, 2020, 7 pages.

International Search Report and Written Opinion issued in PCT/CN2022/131522, dated Jan. 20, 2023, 10 pages.

* cited by examiner

LIQUID COOLING STRUCTURE AND ELECTRONIC APPARATUS

CROSS-REFERENCE TO RELATED APPLICATIONS

This application is a continuation of International Application No. PCT/CN2022/131522, filed on Nov. 11, 2022, which claims priority to Chinese Patent Application No. 202111466572.5, filed on Dec. 3, 2021. The disclosures of the aforementioned applications are hereby incorporated by reference in their entireties.

TECHNICAL FIELD

This disclosure relates to the field of cooling structures, and in particular, to a liquid cooling structure and an electronic apparatus.

BACKGROUND

As power of servers becomes increasingly higher, heat generated by the servers also increases significantly. To meet heat dissipation requirements of the servers, liquid cooling heat dissipation is increasingly commonly used in heat dissipation of the servers.

A cooling medium in a liquid state is used to come into contact with a heat generating unit in a server, so that the heat generating unit may be quickly cooled. In this process, the cooling medium further needs to be driven to move on a surface of the heat generating unit, to quickly take away heat. One driving manner of the cooling medium is controlling a phase transition of the cooling medium. On the one hand, more heat may be absorbed in a form of phase transition latent heat; and on the other hand, the cooling medium in a gaseous state may spontaneously move away from the heat generating unit, thereby accelerating movement of the cooling medium on the surface of the heat generating unit.

However, in a conventional technology, a collection form of the cooling medium needs to be controlled, to facilitate recycling of the cooling medium. For example, the heat generating unit needs to be disposed in high-pressure space, so that a cooling medium obtained after the phase transition changes back to the liquid state in the space, and then recycling is implemented. A high-pressure-resistant and sealed container is required to limit the cooling medium in the high-pressure space. Such a container is not only difficult to manufacture, but also has a high failure rate. Therefore, a server that uses such liquid cooling heat dissipation requires frequent maintenance.

SUMMARY

This disclosure provides a liquid cooling structure and an electronic apparatus, to facilitate recycling of a cooling medium.

A first aspect of embodiments of this disclosure provides a liquid cooling structure, including a liquid storage portion, a liquid cooling portion, a condenser, and a liquid return channel. The liquid storage portion has a liquid storage cavity, and the liquid storage cavity is configured to store a cooling medium in a liquid state. The liquid cooling portion includes a sealing member and a spraying member, where a first sealed cavity is formed in the sealing member, the first sealed cavity is configured to accommodate a to-be-cooled member, the spraying member communicates with the liquid storage cavity, and the spraying member is configured to spray the cooling medium onto the to-be-cooled member, so that the cooling medium undergoes a phase transition to absorb heat. The condenser communicates with the first sealed cavity and the liquid storage cavity, and is configured to cool the cooling medium in a gaseous state in the first sealed cavity to form the cooling medium in the liquid state. The liquid return channel communicates with the first sealed cavity and the liquid storage cavity, and is configured to transfer the cooling medium in the liquid state in the first sealed cavity to the liquid storage cavity.

In the liquid cooling structure, the cooling medium is sprayed onto the to-be-cooled member, and heat of the to-be-cooled member is absorbed in a phase transition manner to form the cooling medium in the liquid state and the cooling medium in the gaseous state. For the cooling media in the two forms, there is no need to specially control an intensity of pressure in the first sealed cavity. That is, the first sealed cavity may be maintained at an atmospheric pressure level, and the liquid cooling portion can also run normally. The cooling medium in the liquid state may be recycled through the liquid storage portion, and the cooling medium in the gaseous state may be recycled through the condenser. Therefore, the sealing member can still run normally under low pressure bearing performance, a failure rate of the sealing member is reduced, and the liquid cooling structure can have low manufacturing difficulty. After the cooling media in the two forms are recycled to the liquid storage cavity, the cooling media may be recycled to the spraying member through the liquid storage cavity for spraying.

Based on the first aspect, in a possible implementation, the spraying member includes a spray plate. A spray cavity is formed in the spray plate, and the spray cavity communicates with the liquid storage cavity. At least one spray hole is further disposed in the spray plate, and the spray hole faces a corresponding to-be-cooled member.

In this possible implementation, the liquid cooling structure receives, through the spray plate, the cooling medium flowing out of the liquid storage cavity, and corresponds to the to-be-cooled member through the spray hole disposed in the spray plate. One spray plate may correspond to a plurality of spray holes, and in this case, the cooling medium may be correspondingly sprayed onto a plurality of to-be-cooled members through one spray plate.

Based on the first aspect, in a possible implementation, the spraying member includes a flow dividing pipe and a plurality of spray heads. The flow dividing pipe includes a main pipe and a plurality of branch pipes, the plurality of branch pipes communicate with the main pipe, and the main pipe communicates with the liquid storage cavity. The plurality of spray heads are connected to the plurality of branch pipes in a one-to-one correspondence, and the spray head faces a corresponding to-be-cooled member.

In this possible implementation, in the liquid cooling structure, the main pipe communicates with the liquid storage cavity, the cooling medium is distributed to the spray heads through the branch pipes, and then the spray heads spray the cooling medium onto the corresponding to-be-cooled members.

Based on the first aspect, in a possible implementation, the liquid cooling structure further includes a first fluid driving member. One end of the first fluid driving member communicates with the liquid storage cavity, the other end communicates with the spraying member, and the first fluid driving member is configured to drive the cooling medium in the liquid state in the liquid storage cavity to be transferred to the liquid cooling portion.

In this possible implementation, in the liquid cooling structure, the cooling medium is driven through the first fluid driving member disposed between the liquid storage cavity and the spraying member. On the one hand, the cooling medium in the liquid storage cavity at a low position may be brought to the spraying member at a high position. On the other hand, a flow rate at the spraying member may be controlled by controlling power of the first fluid driving member, thereby facilitating flow rate control of the spraying member.

Based on the first aspect, in a possible implementation, one end of the condenser extends into the liquid storage cavity.

In this possible implementation, in the liquid cooling structure, the condenser not only cools the cooling medium in the gaseous state entering the condenser, but also may provide a cooling capacity for the liquid storage cavity, so that the cooling medium in the liquid storage cavity is also cooled.

Based on the first aspect, in a possible implementation, the liquid storage portion includes a liquid storage member and a cooling member. The liquid storage cavity is disposed in the liquid storage member. The cooling member is connected to the liquid storage member, and is configured to provide a cooling capacity for the liquid storage member.

In this possible implementation, the liquid cooling structure cools the cooling medium in the liquid storage cavity through the cooling member, so that the cooling medium has a lower temperature when being transferred to the spraying member, and cooling effect of the cooling medium on the to-be-cooled member can be improved.

Based on the first aspect, in a possible implementation, the liquid cooling portion further includes a liquid level sensor and a second fluid driving member. The liquid level sensor is electrically connected to the second fluid driving member. The liquid level sensor is disposed in the first sealed cavity, and is configured to sense a position of the cooling medium in the liquid state in the first sealed cavity. One end of the second fluid driving member communicates with the first sealed cavity, the other end communicates with the liquid storage cavity, and the second fluid driving member is configured to drive the cooling medium in the liquid state in the first sealed cavity to be transferred to the liquid storage cavity.

In this possible implementation, the liquid cooling structure actively transfers the cooling medium in the first sealed cavity to the liquid storage cavity through the liquid level sensor and the second fluid driving member. When a liquid level rises because a speed at which the cooling medium flows out of the first sealed cavity is too slow, the second fluid driving member may be used to increase a flow flux of the cooling medium flowing out of the first sealed cavity.

Based on the first aspect, in a possible implementation, the liquid return channel is connected to the sealing member in a detachable manner.

In this possible implementation, in the liquid cooling structure, the liquid return channel is connected to the sealing member in a detachable manner. This facilitates assembling of the liquid storage portion and the liquid cooling portion.

Based on the first aspect, in a possible implementation, the liquid cooling structure further includes a liquid supply channel, the spraying member communicates with the liquid storage cavity through the liquid supply channel, and the liquid supply channel is connected to the sealing member in a detachable manner.

In this possible implementation, in the liquid cooling structure, the liquid supply channel is connected to the sealing member in a detachable manner. This facilitates assembling of the liquid storage portion and the liquid cooling portion.

Based on the first aspect, in a possible implementation, there are a plurality of liquid cooling portions. The plurality of liquid cooling portions communicate with the one liquid storage portion.

In this possible implementation, the liquid cooling structure can simultaneously provide the cooling medium for the plurality of liquid cooling portions through the one liquid storage portion. This improves expansion performance of the liquid cooling structure.

A second aspect of embodiments of this disclosure provides an electronic apparatus, including a PCBA and the liquid cooling structure provided in the first aspect. The PCBA includes a PCB and a chip, and the PCB is fastened to the chip. The PCB is fastened in a first sealed cavity, and the chip forms a to-be-cooled member.

In the electronic apparatus, heat of the chip is dissipated through the liquid cooling structure, and the heat of the chip is taken away through a phase transition of a cooling medium, so that better heat dissipation effect is achieved.

Based on the second aspect, in a possible implementation, the PCBA further includes a heat dissipation member, the heat dissipation member is connected to the PCB, one side of the heat dissipation member is in contact with the chip, and the other side faces a spraying member.

In this possible implementation, the heat dissipation member may enlarge a heat dissipation area of the chip. After the heat of the chip is transferred to the heat dissipation member, the cooling medium directly acts on the heat dissipation member to take away heat of the heat dissipation member. This further improves heat dissipation efficiency of the chip.

Based on the second aspect, in a possible implementation, the heat dissipation member includes a heat dissipation base and heat dissipation fins, the heat dissipation base is in contact with the chip, and the heat dissipation fins are fastened to one end that is of the heat dissipation base and that is away from the chip.

In this possible implementation, the heat dissipation fins can increase a heat dissipation area of the heat dissipation member, and the cooling medium directly acts on the heat dissipation fins to take away heat of the heat dissipation member. This further improves heat dissipation efficiency of the chip.

Based on the second aspect, in a possible implementation, the PCBA further includes a sealing cover, the sealing cover is fastened to the PCB to form a second sealed cavity, and the chip is disposed in the second sealed cavity. The sealing cover has a first opening and a second opening. The spraying member sprays a cooling medium in a liquid state into the second sealed cavity through the first opening, and a redundant cooling medium can flow out of the second sealed cavity through the second opening.

In this possible implementation, the sealing cover can store some cooling media in the liquid state, so that the chip is partially immersed in the cooling medium in the liquid state. After the cooling medium in the liquid state sprayed through the first opening comes into contact with the chip, a part of the cooling medium in the liquid state undergoes a phase transition to form the cooling medium in the gaseous state. Both a redundant cooling medium in the gaseous state and a redundant cooling medium in the liquid state that are in the second sealed cavity flow out of the second sealed cavity through the second opening, and are further transferred to the liquid storage cavity.

A third aspect of embodiments of this disclosure provides a server, including a server node and the liquid cooling structure provided in the first aspect. The server node includes a housing and a PCBA. The housing forms a sealing member. The PCBA includes a PCB and a chip, and the PCB is fastened to the chip. The PCB is fastened in a first sealed cavity, and the chip forms a to-be-cooled member.

The server is also an electronic apparatus. In the server, heat of the chip is dissipated through the liquid cooling structure, and the heat of the chip is taken away through a phase transition of a cooling medium, so that better heat dissipation effect is achieved.

DESCRIPTION OF MAIN COMPONENT SYMBOLS

Figure 1:
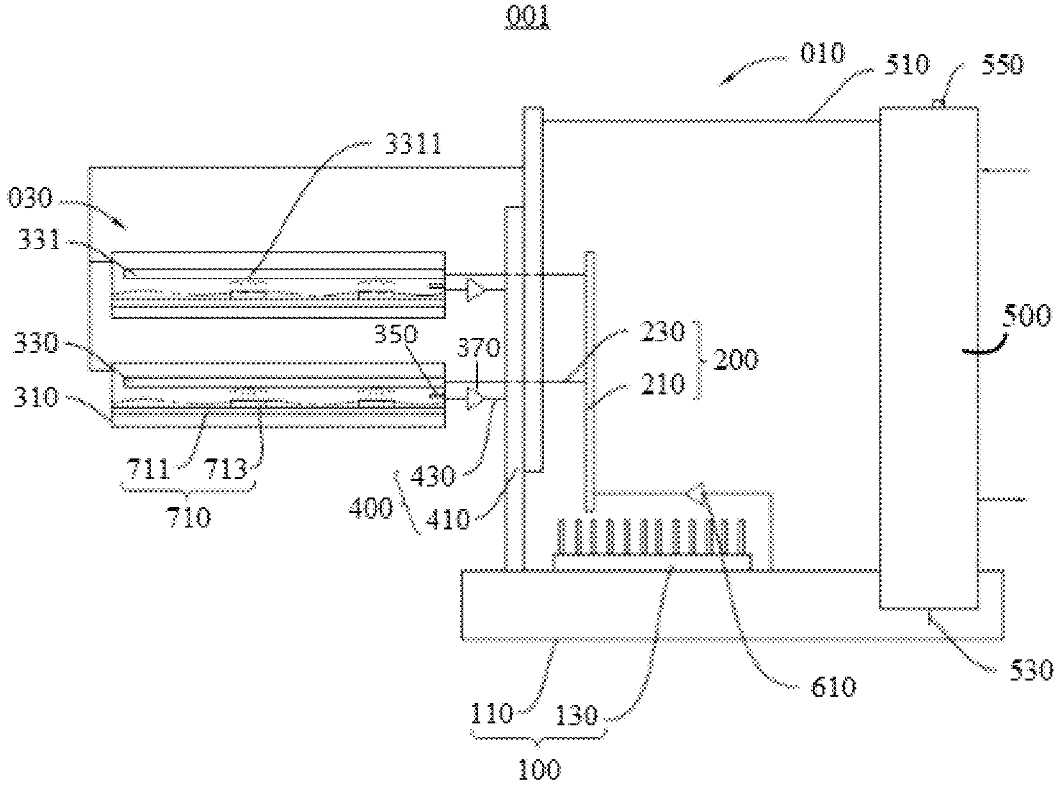
FIG. 1 is a diagram of a structure of a server according to an embodiment of this disclosure.

Server 001
Liquid cooling structure 010
Server node 030
Liquid storage portion 100
Liquid storage member 110
Cooling member 130
Liquid supply channel 200
First liquid supply tube 210
Second liquid supply tube 230
Sealing member 310
First connector 311
Limiting bead 3111
Unlocking member 3113
Second connector 313
Spraying member 330
Spray plate 331
Spray hole 3311
Flow dividing pipe 333
Main pipe 3331
Branch pipe 3333
Spray head 335
Liquid level sensor 350
Second fluid driving member 370
Liquid return channel 400
First liquid return tube 410
Second liquid return tube 430
Condenser 500
First heat exchange inlet 510
First heat exchange outlet 530
Pressure relief opening 550
First fluid driving member 610
PCBA 710
PCB 711
Chip 713
Heat dissipation member 715
Heat dissipation base 7151
Heat dissipation fin 7153
Heat dissipation medium 717
Sealing cover 719
First opening 7191
Second opening 7193

This disclosure is further described in the following specific implementations with reference to the foregoing accompanying drawings.

DESCRIPTION OF EMBODIMENTS

Implementations of this disclosure are described below in specific embodiments, and other advantages and effects of this disclosure may be readily understood by a person skilled in the art from content disclosed in this specification. Although description of this disclosure is provided with reference to embodiments, this does not mean that features of this disclosure are limited to this implementation. On the contrary, a purpose of describing this disclosure with reference to an implementation is to cover another option or modification that may be derived based on claims of this disclosure. To provide an in-depth understanding of this disclosure, the following descriptions include a plurality of specific details. This disclosure may be alternatively implemented without using these details. In addition, to avoid confusion or blurring a focus of this disclosure, some specific details are omitted from the description. It should be noted that embodiments in this disclosure and the features in embodiments may be mutually combined in the case of no conflict.

The following terms “first”, “second”, and the like are merely used for description, and shall not be understood as an indication or implication of relative importance or implicit indication of a quantity of indicated technical features. Therefore, features defined with “first”, “second”, and the like may explicitly or implicitly include one or more such features. In descriptions of this disclosure, unless otherwise stated, “a plurality of” means two or more than two. Orientation terms such as “up”, “down”, “left” and “right” are defined with respect to orientations of components that are schematically placed in accompanying drawings, and it should be understood that these directional terms are relative concepts, are used for relative description and clarification, and may vary accordingly based on a change in the orientation in which the components are disposed in the accompanying drawings.

In this disclosure, if used, unless otherwise expressly specified and limited, the term “connection” should be understood in a broad sense, for example, “connection” may be a fixed connection, may be a detachable connection, or may be an integral connection; or “connection” may be a direct connection or an indirect connection through an intermediate medium. As used in this specification, term “and/or” includes any and all combinations of one or more related listed items.

When the following embodiments are described in detail with reference to diagrams, for ease of description, a diagram indicating a partial structure of a device is not partially enlarged in accordance with a general scale. In addition, the diagrams are merely examples, and should not limit a protection scope of this disclosure.

To make the objectives, technical solutions, and advantages of this disclosure clearer, the following further describes implementations of this disclosure in detail with reference to the accompanying drawings.

FIG. 1 is a diagram of a structure of a server 001 according to an implementation of this disclosure.

The server 001 is an electronic apparatus. The server 001 includes a liquid cooling structure 010 and two server nodes 030. The liquid cooling structure 010 includes a liquid storage portion 100, a liquid return channel 400, a condenser 500, and two liquid cooling portions.

The liquid storage portion 100 includes a liquid storage member 110. The liquid storage member 110 is in a box shape, a liquid storage cavity is formed in the liquid storage member 110, and a cooling medium in a liquid state is stored in the liquid storage cavity.

The liquid cooling portions one-to-one correspond to the server nodes 030. The liquid cooling portion includes a sealing member 310 and a spraying member 330, and a first sealed cavity is formed in the sealing member 310. The server node 030 includes a PCBA 710 (Printed Circuit Board Assembly), the sealing member 310 forms a housing of the server node 030, and the PCBA 710 is disposed in the first sealed cavity. The spraying member 330 is disposed in the first sealed cavity, and faces the PCBA 710. The spraying member 330 communicates with the liquid storage cavity through a liquid supply channel 200, the cooling medium in the liquid storage cavity is transferred to the spraying member 330, and the spraying member 330 sprays the cooling medium to cool the PCBA 710.

The liquid supply channel 200 includes a first liquid supply tube 210 and two second liquid supply tubes 230. One end of the second liquid supply tube 230 communicates with one spraying member 330, and the other end communicates with the first liquid supply tube 210. The first liquid supply tube 210 communicates with the liquid storage cavity, so that the cooling medium in the liquid storage cavity is transferred to the two second liquid supply tubes 230 through the first liquid supply tube 210. Then, the two second liquid supply tubes 230 respectively supply the cooling medium to the two spraying members 330.

The liquid return channel 400 includes a first liquid return tube 410 and two second liquid return tubes 430. One end of the second liquid return tube 430 communicates with one spraying member 330, and the other end communicates with the first liquid return tube 410. The first liquid return tube 410 communicates with the liquid storage cavity, so that the cooling medium in the first sealed cavity may flow back to the liquid storage cavity through the second liquid return tube 430 and the first liquid return tube 410. Then, the two second liquid return tubes 430 respectively supply the cooling medium to the two spraying members 330.

The condenser 500 includes a first heat exchange channel and a second heat exchange channel (not shown in the figure). The first heat exchange channel has a first heat exchange inlet 510 and a first heat exchange outlet 530, and the second heat exchange channel has a second heat exchange inlet and a second heat exchange outlet. The cooling medium in a gaseous state in the first sealed cavity enters the first heat exchange channel through the first heat exchange inlet 510, the cooling medium in the gaseous state is cooled in the first heat exchange channel to form the cooling medium in the liquid state, and the cooling medium in the liquid state enters the liquid storage cavity through the first heat exchange outlet 530. The second heat exchange channel is configured to communicate with a cooling source. The cooling source enters the second heat exchange channel through the second heat exchange inlet, and the cooling source absorbs, in the second heat exchange channel, heat of the cooling medium in the first heat exchange channel. On one hand, the cooling medium in the gaseous state can be converted into the cooling medium in the liquid state, and on the other hand, the cooling medium in the liquid state can be further cooled. The cooling source flows out of the second heat exchange channel through the second heat exchange outlet, and may be recycled and then perform cooling in another device, or may be recycled and then processed in a centralized manner, or may be directly dissipated to an external environment. A position of the first heat exchange inlet 510 is higher than a position of the sealing member 310; and the cooling medium in the gaseous state in the sealing member 310 rises through buoyancy and enters the first heat exchange inlet 510, and then enters the first heat exchange channel. In addition, a phase transition of conversion from the gaseous state to the liquid state occurs in the first heat exchange channel of the condenser 500, and negative pressure can be generated. The negative pressure may drive the cooling medium in the gaseous state in the first sealed cavity to enter the first heat exchange channel.

The cooling medium in the liquid cooling structure 010 has the following circulation path:

The cooling medium in the liquid state in the liquid storage member 110 is transferred to the spraying member 330 through the liquid supply tubes. The spraying member 330 sprays the cooling medium in the liquid state onto the PCBA 710 in the first sealed cavity. After coming into contact with the PCBA 710, a part of the cooling medium in the liquid state absorbs heat, and forms the cooling medium in the gaseous state after a phase transition. The cooling medium in the liquid state in the first sealed cavity is transferred back to the liquid storage member 110 through the liquid return channel 400, and waits for next spraying of the spraying member 330. The cooling medium in the gaseous state in the first sealed cavity enters the condenser 500, at least a part of the cooling medium in the gaseous state is cooled in the condenser 500 to form the cooling medium in the liquid state, and the cooling medium in the liquid state is transferred back to the liquid storage member 110 and waits for next spraying of the spraying member 330.

The cooling medium in the gaseous state and the cooling medium in the liquid state that are in the first sealed cavity may be separately recycled to the liquid storage member 110 through different paths, and there is no need to deliberately control the cooling medium in the first sealed cavity to be in the gaseous state or the liquid state. Therefore, gas pressure in the first sealed cavity may be kept at a level of being approximately atmospheric pressure, in other words, gas pressure outside the first sealed cavity may be approximately consistent with the gas pressure in the first sealed cavity. In this way, a requirement on sealing performance of the sealing member 310 is not high, thereby facilitating a design and manufacturing of the sealing member 310, and a failure rate of the sealing member 310 may be reduced.

It may be understood that the cooling medium in the liquid state in the condenser 500 may alternatively be directly transferred to the liquid cooling portion by the condenser 500, instead of entering the liquid cooling portion through the liquid storage member 110.

Figure 2:
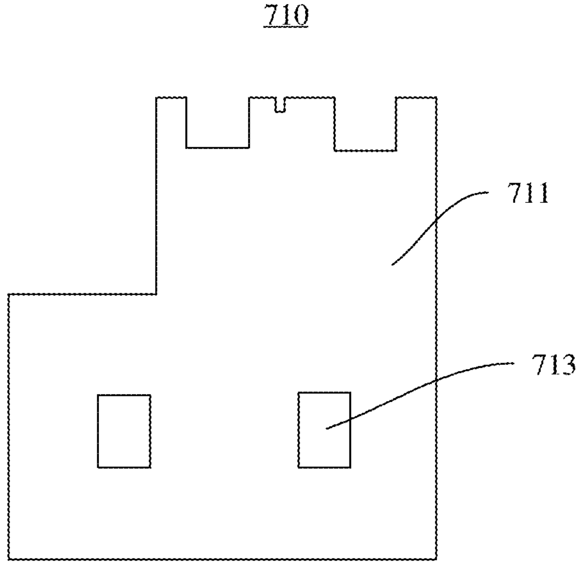
FIG. 2 is a diagram of a structure of a PCBA according to an embodiment of this disclosure.

FIG. 2 is a diagram of a structure of a PCBA 710 according to an implementation of this disclosure.

With reference to FIG. 1 and FIG. 2, the PCBA 710 includes a PCB 711 (Printed Circuit Board) and a chip 713. The PCB 711 is fastened to the sealing member 310, and the chip 713 is fastened to the PCB 711. The chip 713 is a heat generating unit that generates a large amount of heat, in other words, the chip 713 is a to-be-cooled member that needs to be cooled by the liquid cooling portion. The spraying member 330 sprays the cooling medium in a direction of the chip 713, and the cooling medium takes away heat emitted by the chip 713, thereby implementing rapid cooling of the chip 713.

As shown in FIG. 1, the liquid cooling structure 010 further includes a first fluid driving member 610. The first fluid driving member 610 is disposed in the liquid supply channel 200. Optionally, the first fluid driving member 610 may be an electric pump. The first fluid driving member 610 drives the cooling medium in the liquid storage cavity to flow to the first sealed cavity. A flow flux of the cooling medium from the liquid storage cavity to the first sealed cavity may be adjusted by controlling power of the first fluid driving member 610.

The spraying member 330 includes a spray plate 331. A spray cavity is formed in the spray plate 331, and the spray cavity communicates with the liquid storage cavity through the liquid supply channel 200. Spray holes 3311 corresponding to a quantity of chips 713 are further disposed in the spray plate 331. Optionally, one server node 030 has only one PCBA 710, and when two chips 713 are disposed on one PCBA 710, two spray holes 3311 corresponding to the two chips 713 may be disposed in the spray plate 331. One spray hole 3311 corresponds to one chip 713, and the spray hole 3311 sprays the cooling medium in the spray cavity onto the chip 713, so that the cooling medium quickly cools the chip 713.

It may be understood that one spray hole 3311 may include a plurality of small holes, and the cooling medium is sprayed onto a same chip 713 through the plurality of small holes, so that the cooling medium can be distributed to a larger area, and the cooling medium can be presented as a smaller liquid droplet to act on the chip 713, thereby improving heat dissipation efficiency of the chip 713.

It may be understood that, when a server node 030 in one sealing member 310 includes a plurality of PCBAs 710, the PCBAs 710 may be matched by increasing a quantity of spray plates 331 or increasing a quantity of spray holes 3311 on one spray plate 331. When a server node 030 in one sealing member 310 has only one PCBA 710, and only one chip 713 is disposed on one PCBA 710, only one spray hole 3311 may be disposed on one spray plate 331, to cool the chip 713.

Figure 3:
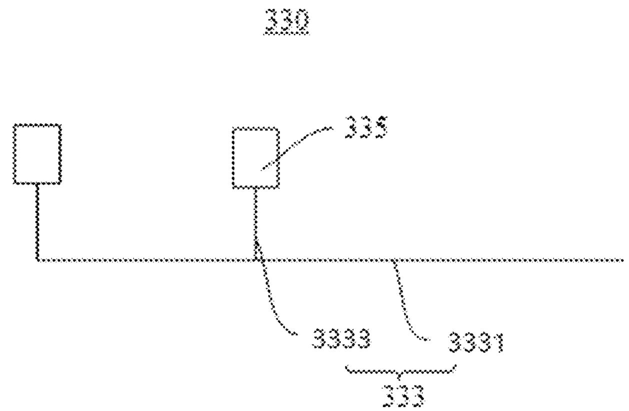
FIG. 3 is a diagram of a structure of a spraying member according to an embodiment of this disclosure.

FIG. 3 shows a diagram of a structure of a spraying member 330 according to this disclosure.

As shown in FIG. 3, the spraying member 330 includes a flow dividing pipe 333 and a plurality of spray heads 335. The flow dividing pipe 333 includes a main pipe 3331 and a branch pipe 3333, and a quantity of branch pipes 3333 corresponds to a quantity of spray heads 335. The main pipe 3331 communicates with the liquid storage cavity through the liquid supply channel 200. One end of the branch pipe 3333 communicates with the main pipe 3331, and the other end is connected to the spray head 335. The quantity of spray heads 335 matches the quantity of chips 713. Optionally, one server node 030 has only one PCBA 710, and when two chips 713 are disposed on one PCBA 710, the flow dividing pipe 333 may include two branch pipes 3333. One spray head 335 corresponds to one chip 713, and the spray head 335 sprays the cooling medium in the flow dividing pipe 333 onto the chip 713, so that the cooling medium quickly cools the chip 713.

It may be understood that the branch pipe 3333 may alternatively not directly communicate with the main pipe 3331. A first branch pipe 3333 may directly communicate with a second branch pipe 3333, and the second branch pipe 3333 directly communicates with the main pipe 3331. In this case, the first branch pipe 3333 communicates with the main pipe 3331 through the second branch pipe 3333.

It may be understood that, when a server node 030 in one sealing member 310 includes a plurality of PCBAs 710, the PCBAs 710 may be matched by increasing the quantity of branch pipes 3333 and the quantity of spray heads 335. When a server node 030 in one sealing member 310 has only one PCBA 710, and only one chip 713 is disposed on one PCBA 710, only one spray head 335 may be disposed, to cool the chip 713.

Figure 4:
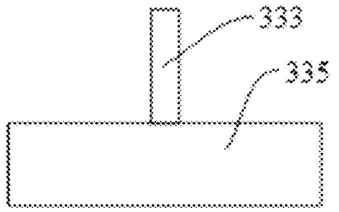
FIG. 4 is a diagram of a structure of a PCBA according to an embodiment of this disclosure.
Figure 4:
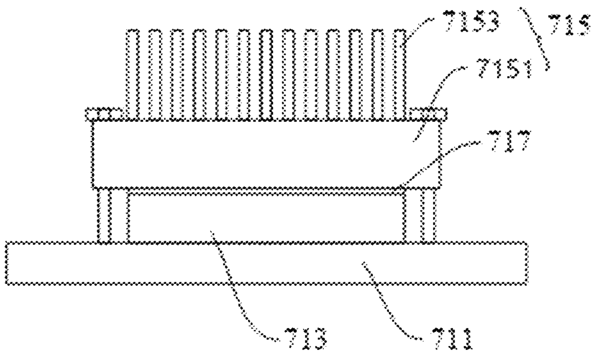

FIG. 4 shows a diagram of a structure of a PCBA 710 according to this disclosure.

With reference to FIG. 1 and FIG. 4, the PCBA 710 includes a PCB 711, a chip 713, and a heat dissipation member 715. The heat dissipation member 715 is disposed on the PCB 711, and is located between the spraying member 330 and the chip 713. One side of the heat dissipation member 715 implements heat conduction with the chip 713 through a heat dissipation medium 717, and the other side faces the spraying member 330 to accept the cooling medium. The heat dissipation medium 717 may be heat dissipation silicone grease, and the heat dissipation medium 717 fills a gap between the heat dissipation member 715 and the chip 713, thereby improving heat transfer efficiency between the chip 713 and the heat dissipation member 715. Heat conduction is implemented between the chip 713 and the heat dissipation member 715, so that heat of the chip 713 is transferred to the heat dissipation member 715, and then dissipated by the heat dissipation member 715. The heat dissipation member 715 has a large surface area, thereby improving heat dissipation efficiency.

The heat dissipation member 715 includes a heat dissipation base 7151 and heat dissipation fins 7153, and the heat dissipation base 7151 and the heat dissipation fins 7153 are integrally formed. The heat dissipation base 7151 is connected to the PCB 711, and the heat dissipation medium 717 is disposed between the heat dissipation base 7151 and the chip 713. The heat dissipation fins 7153 are located on one side that is of the heat dissipation base 7151 and that is away from the chip 713, and the heat dissipation fins 7153 increase a heat dissipation area of the heat dissipation member 715. The cooling medium sprayed by the spraying member 330 comes into contact with the heat dissipation fins 7153, and after the cooling medium in the liquid state absorbs heat on surfaces of the heat dissipation fins 7153, a part of the cooling medium in the liquid state undergoes a phase transition to form the cooling medium in the gaseous state. Heat of the heat dissipation member 715 is quickly taken away through the phase transition of the cooling medium, and accordingly, the heat dissipation member 715 can also quickly take away the heat of the chip 713.

Figure 5:
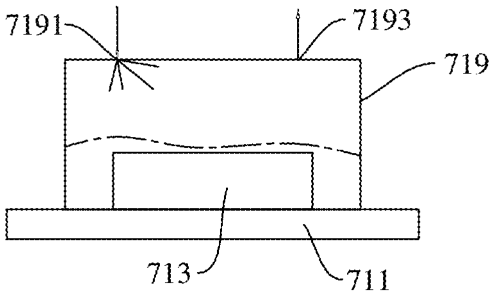
FIG. 5 is a diagram of a structure of a PCBA according to an embodiment of this disclosure.

FIG. 5 shows a diagram of a structure of a PCBA 710 according to this disclosure.

With reference to FIG. 1 and FIG. 5, the PCBA 710 includes a PCB 711, a chip 713, and a sealing cover 719. The sealing cover 719 is fastened to the PCB 711, and the sealing cover 719 and the PCB 711 jointly form a second sealed cavity. It may be understood that the sealing cover 719 is located in the first sealed cavity. Therefore, space of the second sealed cavity is a part of space of the first sealed cavity.

The chip 713 is located in the second sealed cavity, and the second sealed cavity accommodates a part of the cooling medium in the liquid state, so that the chip 713 may be at least partially immersed in the cooling medium in the liquid state. The sealing cover 719 has a first opening 7191 and a second opening 7193, and the first opening 7191 interconnects with the spraying member 330. Specifically, the spraying member 330 is in a form of the spray head 335, the branch pipe 3333 may extend into the second sealed cavity through the first opening 7191, the spray head 335 directly sprays the cooling medium onto the chip 713, the cooling medium in the liquid state comes into contact with the chip 713 to quickly absorb heat, and at least a part of the cooling medium in the liquid state undergoes a phase transition to form the cooling medium in the gaseous state. A redundant cooling medium in the second sealed cavity flows out of the second sealed cavity through the second opening 7193.

When the cooling medium in the second sealed cavity is enough, the chip 713 may be completely immersed in the cooling medium in the liquid state. The cooling medium sprayed by the spray head 335 is mixed into the cooling medium in the liquid state in the second sealed cavity, and continues to rush to the chip 713 by inertia. A part of the cooling medium on a surface of the chip 713 undergoes a phase transition to form the cooling medium in the gaseous state, and the cooling medium in the gaseous state floats in a form of a bubble. Because the spray head 335 continuously fills the second sealed cavity with the cooling medium, the redundant cooling medium emerges in the second sealed cavity, and the redundant cooling medium flows out of the second sealed cavity through the second opening 7193. The cooling medium in the liquid state in the second sealed cavity may return to the liquid storage cavity through the liquid return channel 400 connected to the first sealed cavity, and the cooling medium in the gaseous state in the second sealed cavity may enter the condenser 500 through the first heat exchange channel connected to the first sealed cavity.

It may be understood that, when the PCBA 710 includes the sealing cover 719, the PCBA 710 may also include the heat dissipation member 715, and the heat dissipation member 715 is disposed in the sealing cover 719, so that a heat dissipation area of the chip 713 can be increased through the heat dissipation member 715. The cooling medium sprayed by the spraying member 330 into the second sealed cavity may act on the heat dissipation member 715 to implement heat dissipation of the chip 713.

The sealing member 310 is disposed above the liquid storage member 110. When the first sealed cavity communicates with the liquid storage cavity through the liquid return channel 400, the cooling medium in the liquid state in the first sealed cavity may flow back to the liquid storage cavity through the liquid return channel 400 by gravity of the cooling medium in the liquid state.

Refer to FIG. 1. The liquid cooling portion further includes a liquid level sensor 350 and a second fluid driving member 370. One end of the second fluid driving member 370 communicates with the first sealed cavity, and the other end communicates with the liquid storage cavity. The liquid level sensor 350 is electrically connected to the second fluid driving member 370, and startup and shutdown of the second fluid driving member 370 may be controlled based on a signal from the liquid level sensor 350. The liquid level sensor 350 is disposed in the first sealed cavity, and is configured to sense a liquid level of the cooling medium in the first sealed cavity. When the liquid level in the first sealed cavity reaches a preset height, the second fluid driving member 370 starts or increases power based on a signal from the liquid level sensor 350. The second fluid driving member 370 drives the cooling medium in the first sealed cavity to flow to the liquid storage cavity.

Optionally, the second fluid driving member 370 is an electric pump. The second fluid driving member 370 is disposed in the liquid return channel 400. When the liquid level in the first sealed cavity is low, the second fluid driving member 370 may run at low power. Alternatively, no check valve is disposed in the second fluid driving member 370, and the cooling medium in the first sealed cavity may flow to the liquid storage cavity by gravity of the cooling medium when the second fluid driving member 370 does not run. When the liquid level in the first sealed cavity rises to the preset height, the second fluid driving member 370 increases power to run, so that the cooling medium in the first sealed cavity quickly flows out.

Optionally, an auxiliary channel is further disposed between the first sealed cavity and the liquid storage cavity, and the second fluid driving member 370 is disposed in the auxiliary channel. When the liquid level in the first sealed cavity is low, the second fluid driving member 370 may not run. The cooling medium in the first sealed cavity may flow to the liquid storage cavity through the liquid return channel 400 by gravity of the cooling medium. When the liquid level in the first sealed cavity rises to the preset height, the second fluid driving member 370 starts, so that the cooling medium in the first sealed cavity quickly flows out through the auxiliary channel. At the same time, a part of the cooling medium in the first sealed cavity can also flow to the liquid storage cavity through the liquid return channel 400 by gravity of the cooling medium.

The condenser 500 is located above the liquid storage member 110. The cooling medium in the gaseous state that enters the condenser 500 through the first sealed cavity forms the cooling medium in the liquid state after being cooled. The cooling medium in the liquid state may flow to the liquid storage cavity by gravity of the cooling medium in the liquid state. The condenser 500 is partially inserted into the liquid storage cavity. The condenser 500 provides a cooling capacity for the liquid storage cavity, to further cool the cooling medium in the liquid storage cavity, so that the cooling source in the condenser 500 can be fully used. The cooling capacity is a total energy value of heat derived from the liquid storage cavity by the condenser 500 in a period of time.

Optionally, the condenser 500 may be a finned-tube heat exchanger, and the finned-tube heat exchanger may not have the second heat exchange channel. The cooling medium in the first heat exchange channel transfers heat to fins of the finned-tube heat exchanger, and the fins quickly dissipate the heat.

It may be understood that the liquid storage portion 100 may further include a cooling member 130. The cooling member 130 is connected to the liquid storage member 110. The cooling member 130 may be a heat exchanger, and the cooling source flows in the cooling member 130. One end of the cooling member 130 is in contact with the liquid storage member 110, heat of the cooling medium in the liquid storage member 110 is transferred to the cooling member 130, and then the heat is taken away by the cooling source in the cooling member 130. In this way, a temperature of the cooling medium in the liquid storage portion 100 may be reduced, so that the cooling medium sprayed onto the chip 713 by the spraying member 330 has a lower temperature, thereby improving cooling effect.

A pressure relief opening 550 is further disposed on the top of the condenser 500. If air enters the liquid cooling structure 010 in a running process of the liquid cooling structure 010, the air is mixed up with the cooling medium in the gaseous state and enters the condenser 500. The air still exists in the condenser 500 in a form of gas, and this part of air may be discharged through the pressure relief opening 550. In this process, a part of the cooling medium in the gaseous state may also be discharged along with the air.

Figure 6:
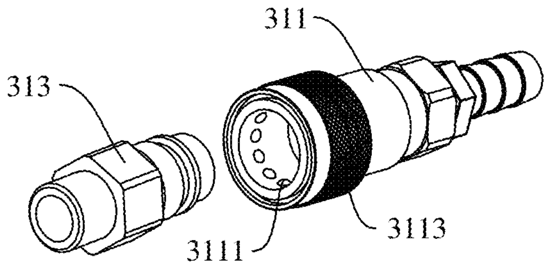
FIG. 6 is a diagram of partial structures of a liquid return channel and a sealing member according to an embodiment of this disclosure.

FIG. 6 shows a diagram of partial structures of a liquid return channel 400 and a sealing member 310 according to this disclosure.

As shown in FIG. 6, the sealing member 310 includes a first connector 311, and the liquid return channel 400 includes a second connector 313. The first connector 311 has a jack, and the second connector 313 can be inserted into the jack. There is a sealing ring in the jack of the first connector 311, and after the second connector 313 is inserted into the jack, outer circumference may be sealed. There is further a limiting member in the jack, and the limiting member includes an elastic member and a limiting bead 3111. The elastic member is fastened to the first connector 311, and the limiting bead 3111 has a trend of moving towards an axis of the jack under an action of the elastic member. When the second connector 313 is inserted into the jack, the limiting bead 3111 compresses the elastic member under acting force of the second connector 313 until the limiting bead 3111 enters a limiting slot of the second connector 313, and the limiting bead 3111 is embedded into the limiting slot under an action of the elastic member. An axial limiting connection is implemented between the first connector 311 and the second connector 313 under an action between the limiting bead 3111 and an inner wall of the limiting slot. The first connector 311 further includes an unlocking member 3113. The unlocking member 3113 is connected to the elastic member. The unlocking member 3113 is rotated to release an elastic action of the elastic member on the limiting bead 3111, so that the limiting bead 3111 may move in a direction away from the axis of the jack, to unlock the axial limiting connection between the first connector 311 and the second connector 313.

It may be understood that a connection between the liquid supply channel 200 and the spraying member 330 may also be implemented in a form of the first connector 311 and the second connector 313. Detachable fitting between the first connector 311 and the second connector 313 makes assembling of the liquid cooling portion and the liquid storage portion 100 more convenient.

It may be understood that a connection form between the liquid return channel 400 and the sealing member 310 may also be set as follows: A plug is disposed on the sealing member 310, and a socket is disposed on the liquid return channel 400. A rubber member is disposed at a jack of the socket, and a plug hole is formed in the middle of the rubber member. The plug may be inserted into the plug hole to implement a connection between the sealing member 310 and the liquid return channel 400.

The server 001 cools the chip 713 through the phase transition of the cooling medium, and the phase transition of the cooling medium can absorb a large amount of heat, thereby improving cooling effect. In addition, the liquid cooling portion does not need to apply extra pressure to control a form of the cooling medium in the liquid cooling portion, the cooling medium in the liquid state in the liquid cooling portion is recycled through the liquid return channel 400, and the cooling medium in the gaseous state in the liquid cooling portion is recycled through the condenser 500. After being cooled, the recycled cooling medium is uniformly stored in the liquid storage cavity in a form of liquid, and then is cyclically transferred to the liquid cooling portion through the liquid storage cavity to cool the chip 713.

It may be understood that the electronic apparatus may alternatively be another device such as a communication device or a storage device, and heat of a heat generating part of the electronic apparatus can be quickly taken away through the liquid cooling structure 010.

The foregoing description is merely specific implementations of this disclosure, but is not intended to limit the protection scope of this disclosure. Any variation or replacement within the technical scope disclosed in this disclosure shall fall within the protection scope of this disclosure.

What is claimed is:

1. A liquid cooling structure comprising:

a liquid storage portion, having a liquid storage cavity, wherein the liquid storage cavity is configured to store a cooling medium in a liquid state;

a liquid cooling portion, comprising a sealing member and a spraying member, wherein a first sealed cavity is formed in the sealing member, the first sealed cavity is configured to accommodate a to-be-cooled member, the spraying member is configured to communicate with the liquid storage cavity, and the spraying member is configured to spray the cooling medium onto the to-be-cooled member, so that the cooling medium is configured to undergo a phase transition to absorb heat;

a condenser, configured to communicate with the first sealed cavity and the liquid storage cavity, and configured to cool the cooling medium in a gaseous state in the first sealed cavity to form the cooling medium in the liquid state; and a liquid return channel, configured to communicate with the first sealed cavity and the liquid storage cavity, and configured to transfer the cooling medium in the liquid state in the first sealed cavity to the liquid storage cavity;

wherein the spraying member is configured to spray the cooling medium into a second sealed cavity through a first opening of the second sealed cavity, and a redundant cooling medium is configured to flow out of the second sealed cavity through a second opening of the second sealed cavity; and a space of the second sealed cavity is a part of a space of the first sealed cavity; and the to-be-cooled member is located in the second sealed cavity.

2. The liquid cooling structure according to claim 1, wherein the spraying member comprises a spray plate;

a spray cavity is formed in the spray plate, and the spray cavity is configured to communicate with the liquid storage cavity; and at least one spray hole is further disposed in the spray plate, and the at least one spray hole is configured to face the to-be-cooled member.

3. The liquid cooling structure according to claim 1, wherein the spraying member comprises a flow dividing pipe and a plurality of spray heads;

the flow dividing pipe comprises a main pipe and a plurality of branch pipes, the plurality of branch pipes communicate with the main pipe, and the main pipe is configured to communicate with the liquid storage cavity; and the plurality of spray heads are connected to the plurality of branch pipes in a one-to-one correspondence, and each of the plurality of spray heads is configured to face a corresponding one of a plurality of to-be-cooled members.

4. The liquid cooling structure according to claim 1, wherein the liquid cooling structure further comprises a fluid driving member; and one end of the fluid driving member is configured to communicate with the liquid storage cavity, another end is configured to communicate with the spraying member, and the fluid driving member is configured to drive the cooling medium in the liquid state in the liquid storage cavity to be transferred to the liquid cooling portion.

5. The liquid cooling structure according to claim 1, wherein one end of the condenser extends into the liquid storage cavity.

6. The liquid cooling structure according to claim 1, wherein the liquid storage portion comprises a liquid storage member and a cooling member;

the liquid storage cavity is disposed in the liquid storage member; and the cooling member is connected to the liquid storage member, and is configured to provide a cooling capacity for the liquid storage member.

7. The liquid cooling structure according to claim 1, wherein the liquid cooling portion further comprises a liquid level sensor and a fluid driving member;

the liquid level sensor is electrically connected to the fluid driving member;

the liquid level sensor is disposed in the first sealed cavity, and is configured to sense a position of the cooling medium in the liquid state in the first sealed cavity; and one end of the fluid driving member is configured to communicate with the first sealed cavity, another end is configured to communicate with the liquid storage cavity, and the fluid driving member is configured to drive the cooling medium in the liquid state in the first sealed cavity to be transferred to the liquid storage cavity.

8. The liquid cooling structure according to claim 1, wherein the liquid return channel is connected to the sealing member in a detachable manner.

9. The liquid cooling structure according to claim 1, wherein the liquid cooling portion comprises a plurality of liquid cooling portions; and the plurality of liquid cooling portions is configured to communicate with the liquid storage portion.

10. An electronic apparatus comprising: a Printed Circuit Board Assembly (PCBA) and a liquid cooling structure, wherein the PCBA comprises a Printed Circuit Board (PCB) and a chip, and the PCB is fastened to the chip; and the PCB is fastened in a first sealed cavity, and the chip forms a to-be-cooled member;

wherein; the liquid cooling structure comprises:

a liquid storage portion, having a liquid storage cavity, wherein the liquid storage cavity is configured to store a cooling medium in a liquid state;

a liquid cooling portion, comprising a sealing member and a spraying member, wherein the first sealed cavity is formed in the sealing member, the first sealed cavity is configured to accommodate the to-be-cooled member, the spraying member is configured to communicate with the liquid storage cavity, and the spraying member is configured to spray the cooling medium onto the to-be-cooled member, so that the cooling medium is configured to undergo a phase transition to absorb heat;

a condenser, configured to communicate with the first sealed cavity and the liquid storage cavity, and configured to cool the cooling medium in a gaseous state in the first sealed cavity to form the cooling medium in the liquid state; and a liquid return channel, configured to communicate with the first sealed cavity and the liquid storage cavity, and configured to transfer the cooling medium in the liquid state in the first sealed cavity to the liquid storage cavity; and wherein the PCBA further comprises a sealing cover, the sealing cover is fastened to the PCB to form a second sealed cavity, and the chip is disposed in the second sealed cavity;

the sealing cover has a first opening and a second opening; and the spraying member is configured to spray the cooling medium in the liquid state into the second sealed cavity through the first opening, and a redundant cooling medium is configured to flow out of the second sealed cavity through the second opening.

11. The electronic apparatus according to claim 10, wherein the spraying member comprises a spray plate;

a spray cavity is formed in the spray plate, and the spray cavity is configured to communicate with the liquid storage cavity; and at least one spray hole is further disposed in the spray plate, and the at least one spray hole is configured to face the to-be-cooled member.

12. The electronic apparatus according to claim 10, wherein the spraying member comprises a flow dividing pipe and a plurality of spray heads;

the flow dividing pipe comprises a main pipe and a plurality of branch pipes, the plurality of branch pipes is configured to communicate with the main pipe, and the main pipe is configured to communicate with the liquid storage cavity; and the plurality of spray heads are connected to the plurality of branch pipes in a one-to-one correspondence, and each of the plurality of spray heads is configured to face a corresponding one of a plurality of to-be-cooled members.

13. The electronic apparatus according to claim 10, wherein the liquid cooling structure further comprises a fluid driving member; and one end of the fluid driving member is configured to communicate with the liquid storage cavity, another end is configured to communicate with the spraying member, and the fluid driving member is configured to drive the cooling medium in the liquid state in the liquid storage cavity to be transferred to the liquid cooling portion.

14. The electronic apparatus according to claim 10, wherein one end of the condenser extends into the liquid storage cavity.

15. The electronic apparatus according to claim 10, wherein the liquid storage portion comprises a liquid storage member and a cooling member;

the liquid storage cavity is disposed in the liquid storage member; and the cooling member is connected to the liquid storage member, and is configured to provide a cooling capacity for the liquid storage member.

16. The electronic apparatus according to claim 10, wherein the liquid return channel is connected to the sealing member in a detachable manner.

17. The electronic apparatus according to claim 10, wherein the liquid cooling portion comprises a plurality of liquid cooling portions; and the plurality of liquid cooling portions is configured to communicate with the liquid storage portion.

18. The electronic apparatus according to claim 10, wherein the PCBA further comprises a heat dissipation member, the heat dissipation member is connected to the PCB, one side of the heat dissipation member is in contact with the chip, and another side is configured to face the spraying member.

19. The electronic apparatus according to claim 18, wherein the heat dissipation member comprises a heat dissipation base and heat dissipation fins, the heat dissipation base is in contact with the chip, and the heat dissipation fins are fastened to one end of the heat dissipation base and that is away from the chip.

* * * * *